United States Patent

Dunmead et al.

US005383421A

[11] Patent Number: 5,383,421
[45] Date of Patent: Jan. 24, 1995

[54] METHOD FOR FORMING BETA-SILICON CARBIDE WHISKERS, SINGLY OR IN A MATRIX, USING AN ORGANOTITANIUM COORDINATION COMPOUND CATALYST

[75] Inventors: Stephen D. Dunmead; Kevin E. Howard, both of Midland, Mich.

[73] Assignee: The Dow Chemical Company, Midland, Mich.

[21] Appl. No.: 64,527

[22] Filed: May 19, 1993

[51] Int. Cl.$^6$ .............................................. C30B 1/10
[52] U.S. Cl. ........................................... 117/4; 117/7; 117/921; 117/951; 423/345
[58] Field of Search ....... 156/603, DIG. 64, DIG. 68, 156/DIG. 112; 423/345; 501/88; 117/4, 7, 921, 951

[56] References Cited

U.S. PATENT DOCUMENTS

| | | | |
|---|---|---|---|
| 3,840,647 | 10/1974 | Tomita et al. | 156/DIG. 112 |
| 4,500,504 | 2/1985 | Yamamoto | 156/DIG. 112 |
| 5,087,433 | 2/1992 | Enomoto et al. | 423/346 |

FOREIGN PATENT DOCUMENTS

| | | | |
|---|---|---|---|
| 02221198 | 9/1990 | Japan | 156/DIG. 112 |
| 2186208 | 8/1987 | United Kingdom | 156/DIG. 112 |

*Primary Examiner*—Robert Kunemund

[57] ABSTRACT

Beta-silicon carbide whiskers of superior uniformity can be formed, either singly or in-situ in a matrix, by heating a source for silicon with a source of carbon (greater than 0 percent but less than or equal to about 60 percent of stoichiometric, with respect to the silicon source) in the presence of a titanium-containing catalyst, such as titanocene dichloride. Advantageously, the titanium catalyst can be applied by drying a solution of the titanium catalyst on the carbon and silicon sources. The titanium, carbon and silicon sources are then heated together, preferably to between about 1800° C. and about 1850° C., resulting in a product containing high quality beta-silicon carbide whiskers. The silicon source can be silicon nitride powder, which can either be substantially converted to free-flowing whiskers, or in the alternative, the silicon nitride powder, carbon source and titanium catalyst can be formed into a conventional ceramic matrix prior to conversion to beta-silicon carbide whiskers, so the whiskers formed therein will serve as a reinforcement for the ceramic matrix.

15 Claims, No Drawings

METHOD FOR FORMING BETA-SILICON CARBIDE WHISKERS, SINGLY OR IN A MATRIX, USING AN ORGANOTITANIUM COORDINATION COMPOUND CATALYST

TECHNICAL FIELD

The present invention is directed to the preparation of ceramic materials useful for reinforcing composite materials, or the reinforced materials themselves, and more particularly to a method for forming beta-silicon carbide whiskers useful for that purpose.

BACKGROUND OF THE INVENTION

The use of ceramic particles for reinforcing, strengthening, and toughening metallic, polymeric or ceramic matrix materials has grown increasingly important in recent years. Such particles are typically shaped as whiskers, fibers, platelets or the like. For example, silicon carbide whiskers are used to reinforce alumina or silicon nitride matrices for cutting tools. The beta-crystalline form of silicon carbide has been found to be especially useful for these purposes, since it has excellent mechanical properties, good thermal conductivity, and good oxidation resistance.

The use of beta-silicon carbide whiskers has encountered drawbacks, however, most notably in the methods of making the whiskers. For example, silicon carbide whiskers have been made from rice hulls (chaff) by heating the hulls to temperatures high enough to react silicon contained in the hull structure with carbon in the hulls. Methods of this sort typically include coking the rice hulls before their conversion to silicon carbide. Unfortunately, such methods are usually of low efficiency; excess carbon must typically be burned off from the product, and the average silicon carbide whisker content of the burned-off product is only 15-20 percent. While differential wetting before burn-off can improve the free-flow characteristics, deagglomeration processes can be time consuming and can require significant capital investment in separation equipment. Making sure that the whiskers are free-flowing is important because agglomerated whiskers won't evenly disperse into a matrix.

A variety of efforts have been made to improve the efficiency of methods for producing silicon carbide particles. For example, JP 62-036100 and JP 61-022000 disclose methods for preparing silicon carbide whiskers by heating mixtures including silicon nitride, carbon and a catalyst such as iron, nickel or cobalt metal or oxide. JP 61-291498 and JP 61-257000 disclose methods for manufacturing silicon carbide whiskers from a gaseous silane in the presence of a metallic catalyst (such as titanium) in the form of a metallic powder, or in the form of a gaseous metal or metal compound, respectively. JP 63-103899 and JP 60-260496 disclose methods for making silicon carbide whiskers from carbonaceous and silicic powders or gases, respectively, each entailing the decomposition of a transition metal compound gas (for example, ferrocene) as a catalyst. While all of these methods have generally been successful for their intended purposes, they are typically slow, inefficient and expensive, and often yield silicon carbide particles of mixed alpha- and beta-phases and inhomogeneous composition.

Efforts have also been made to form silicon carbide whiskers directly in situ in a silicon nitride matrix. For example, JP 60-064970 and JP 60-064969 disclose methods of forming silicon carbide whiskers in a silicon nitride article, but only from elemental silicon in the article, and not from the silicon nitride making up the article. In JP 60-064970, the elemental silicon is an unreacted residual, left over from the partial nitriding of a shaped silicon body, while in JP 60-064969, the elemental silicon is impregnated into a sintered or calcined porous silicon nitride.

While each of these two methods avoids the free flow and dispersion problems previously encountered when separate silicon carbide whiskers were added to a silicon nitride matrix, they each inconveniently require a separate treatment step of the matrix material before the silicon carbide whiskers can be formed. This increases the cost and complexity of obtaining the desired end product, and may make the product less homogeneous or more subject to contamination.

It would be desirable to form silicon carbide whiskers within a silicon nitride matrix or from silicon nitride contained in some other matrix. It would also be desirable to obviate the inefficiencies and inhomogeneity encountered in prior methods for making the whiskers themselves.

Therefore, it would be advantageous to provide a high-yielding method for the rapid and economic formation of free-flowing beta-silicon carbide whiskers, especially whisker particles of superior smoothness and uniformity of diameter and size, with a greater percentage of whiskers being in the beta-crystalline form, and less non-whisker particles or whiskers in alpha-crystalline form, than present in previous products.

In addition, it would be especially advantageous to provide a method of directly forming beta-silicon carbide whiskers in situ within a silicon nitride matrix from the silicon nitride itself which makes up the matrix.

SUMMARY OF THE INVENTION

In accordance with a preferred embodiment of the invention, these and other advantages are addressed as follows.

Applicants have discovered that these advantages can be met by heating a solid silicon-containing source with a limited amount of a carbon source in the presence of a titanium-containing catalyst. The source of silicon can be silicon nitride or another silicon-containing material, while the carbon source can be carbon black, and the source of titanium can be an organotitanium coordination catalyst. A particularly preferred combination is silicon nitride and carbon black with titanocene dichloride.

The amount of the carbon source can be optimized, as discussed further below, to successfully obtain beta-phase silicon carbide whiskers as the sole silicon carbide product. For example, for a stoichiometric reaction of silicon nitride and elemental carbon yielding silicon carbide and molecular nitrogen as products (that is, $Si_3N_4 + 3C \rightarrow 3SiC + 2N_4$), the carbon makes up about 20.5 percent by weight of the initial reactant mixture of the silicon nitride and carbon. For achievement of high quality beta-phase silicon carbide whiskers as the only appreciable silicon carbide product, the amount of carbon in the initial reactant mixture should be greater than 0 percent but less than or equal to about 60 percent of stoichiometric with respect to the silicon source. Thus, when the silicon source in this reaction is silicon nitride, it is preferred that it is mixed with less than about 10.3 percent by weight carbon, before heating in the presence of the titanium source.

While titanium metal has been used in making silicon carbide in prior methods, the use of titanium with silicon nitride as a reactant appears novel to this invention, as does the use of an organotitanium coordination catalyst with any silicon source. Such uses give the present invention numerous advantages over the prior art. The method of the present invention enjoys more rapid formation of the beta-silicon carbide whiskers than in prior methods, yielding a superior economy of manufacture of the beta-silicon carbide whiskers. The method of the present invention also yields whiskers having a higher percentage of beta-phase than many prior methods. These whiskers have a superior uniformity of diameter and size in contrast to prior products, that is, the present invention achieves a product which is decidedly more homogeneous than that obtained by prior methods. The whiskers achieved in the present invention also have smoother surfaces and are less branched than whiskers obtained by prior methods.

In a first aspect, then, the present invention is directed to a method for forming free-flowing beta-silicon carbide whiskers. The method includes heating a solid silicon source and a carbon source in the presence of a titanium catalyst wherein the silicon source is selected from the group consisting of silicon binary compounds, e.g. silicon nitride; the carbon source may be selected from the group consisting of carbon black, acetylene black, lampblack, and graphite; and the titanium catalyst is selected from the group consisting of organotitanium coordination compounds and titanium-containing catalysts.

In another aspect of the invention, the silicon source may be silicon nitride which is then formed into a ceramic matrix. The matrix has the carbon and the titanium catalyst mixed with the silicon nitride powder prior to pressing together the powders into a ceramic matrix and also prior to the conversion of the silicon and carbon to beta-silicon carbide whiskers. The whiskers then form homogeneously within the matrix.

DETAILED DESCRIPTION OF THE INVENTION

As indicated, the present invention entails heating certain combinations of silicon and carbon in the presence of a titanium catalyst. The heating is most advantageously carried out on a milled mixture of powders of the silicon and carbon sources. While the organotitanium coordination catalyst, if used, may serve as a partial source of carbon, its contribution of carbon will typically be minimal and can be disregarded in determining the amount of the carbon source.

The silicon source can be expected to include any of the silicon-containing materials conventionally used to form silicon carbide. In order to reduce the possibility of producing unwanted byproducts, it is preferred that the silicon source be a silicon-containing binary compound. Silicon dioxide (silica) is an example of a binary silicon source useful in the present invention. However, silicon nitride is the preferred silicon source in the practice of the present invention. It is also preferred that the silicon source be solid, especially in powder form.

Since it is highly desirable that only silicon carbide whiskers are formed, the heating step should be carried out so that the silicon, carbon and titanium sources are not in direct contact with any other carbonaceous material during heating. For example, the sources should not be heated directly in a graphite crucible or on a flexible graphite foil, without isolation from contact with them. Using a boron nitride crucible or a BN coating on furnace components can provide the required isolation.

The reason for isolation is simple. As noted above, Applicants have discovered that the amount of carbon present for reaction appears to effect the morphology of the beta-silicon carbide product obtained upon heating. When an amount of carbon is supplied which is less than or about equal to about 60 percent by weight stoichiometric, and heating occurs in the presence of an appropriate titanium source, a beta-silicon carbide product is formed as high quality whiskers. On the other hand, if a greater than stoichiometric amount of carbon is present, the product formed may be in the form of beta-silicon carbide platelets or other particles. In between these, an amount of carbon greater than about 60 percent stoichiometric but less than or equal to fully stoichiometric yields a mixed product including beta-silicon carbide platelets and other particles, beta-silicon carbide whiskers of poor form, and unreacted silicon source.

As with the silicon source, it is preferred that the carbon source be a solid powder, although gaseous sources of carbon are contemplated within the invention as well. In order to reduce the potential for undesired side products, it is particularly preferred that the carbon source be a source of pure carbon. Carbon black, for example, acetylene carbon black, has been found particularly useful for this purpose.

A wide variety of titanium-containing materials can be expected to be useful in the practice of the present invention, depending upon the silicon source selected. When the silicon source is silicon nitride, the titanium source can be any titanium-containing compound which is catalytic for the formation of silicon carbide. Examples of the last of these are the titanium halides (for example, the titanium tri- and tetrachlorides), the titanium oxides (particularly the di- and trioxides), and titanium oxalate. Preferably, however, the titanium source is an organotitanium coordination compound.

The organotitanium coordination compounds preferred for use in the present invention are the titanocenes, the titanium chelates, and the titanium di-, tri-, and tetraesters, with titanocene dichloride being particularly preferred. Titanocene dichloride is the common name for biscyclopentadienyltitanium dichloride, or $(\eta^5\text{-}C_5\text{-}H_5)TiCl_2$, a known stereospecific Ziegler polymerization catalyst (with aluminum alkyls).

More generally, the titanocenes include compounds of the general formulas $(\eta^5\text{-}C_5H_5)_2TiX_2$ or $(\eta^5\text{-}C_5H_5)TiX_3$, wherein X is selected from the group consisting of halides, carbonyls, nitrosyls, or lower ($C_1$ to $C_{12}$) aliphatic or aromatic ligands (such as p-dimethylaminophenol, phenyls, m-tolyl, p-tolyl or complexes of a phenyl group singly, multiply or fully substituted with methyl, ethyl or isopropyl groups). Exemplary titanocenes are biscyclopentadienyltitanium diiodide, biscyclopentadienyltitanium dichloride, biscyclopentadienyltitanium dibromide, di(p-dimethylaminophenol) biscyclopentadienyltitanium, diphenyl biscyclopentadienyltitanium, di(m-tolyl) biscyclopentadienyltitanium, di(p-tolyl) biscyclopentadienyltitanium, di(methylphenyl) biscyclopentadienyltitanium, di(ethylphenyl) biscyclopentadienyltitanium, di(isopropylphenyl) bis-cyclopentadienyltitanium, di(pentamethylphenyl) biscyclopentadienyltitanium, and di(tetraisopropylphenyl) biscyclopentadienyltitanium.

Similarly, as a group the titanocenes should also be considered to include homologous materials having substituted cyclopentadienyl ligands, rather than the unsubstituted $eta^5$-$C_5H_5$ ligand. Exemplary substituted ligands are $eta^5$-$C_5(CH_3)_5$ and $eta^5$-$C_5H_4R$, wherein R is methyl, ethyl or isopropyl.

The titanium chelates are compounds of the general formulas $(HOR_1O)_2Ti(OR_2)_2$ or $(H_2NR_1O)_2Ti(OR_2)_2$, wherein $R_1$ and $R_2$ are each independently a lower ($C_1$ to $C_{12}$) aliphatic or aromatic ligand, as described above. Exemplary titanium chelates are octylene glycol titanate and triethanolamine titanate.

The titanium di-, tri-, and tetraesters are compounds of the general formula $Ti(OR)_n X_{4-n}$, wherein n is 2, 3 or 4; X is defined as above with regard to the titanocenes; and R is a lower ($C_1$ to $C_{12}$) aliphatic or aromatic ligand as described above, and can be different for each of the (OR) groups. Exemplary titanium esters are titanylacetylacetonate, tetrabutyl titanate, tetra (2-ethylhexyl)titanate, tetraisopropyl titanate, monochlorotriethoxytitanium, phenyltitanium triisopropylate, tetraethoxytitanium, tetramethoxytitanium, titanium isoproproxide, titaniummonochloro-tri-2-ethoxyethoxide, titanium tetra-n-hexoxide, titanium tetraisobutoxide, and titanium tetra-n-pentoxide.

This listing of compounds is not intended to suggest that other organotitanium coordination compounds are not useful in the practice of the present invention. Nor is this listing of compounds intended to suggest that all organotitanium coordination compounds will be useful with all sources of silicon. Rather, the identified compounds exemplify the classes of compounds having utility in the present invention.

The heating temperature also appears to play an important role in achieving high quality whiskers. Theoretically, it should be possible to obtain products containing at least some whiskers at temperatures as low as 1374° C. However, we have found that low temperature products typically are of poor uniformity and shape. Accordingly, the preferred temperature range is about 1800° C. to about 1850° C.; the upper limit of this range being below the sublimation or decomposition temperature of silicon nitride (between about 1850° C. and about 1900° C.).

It is desirable that the titanium source be uniformly mixed with the silicon and carbon sources before heating, for example, by being applied to them. Accordingly, as an aspect of the invention, this is conveniently done by first disposing a liquid solution of the titanium catalyst onto the silicon and the carbon sources; drying the solution on them; heating them to about 1800° to 1850° C. so as to form the desired beta-silicon carbide whiskers. The silicon source and carbon source can also be pressed before heating, but preferably after preheating.

In general, the present invention is most conveniently carried out by using solid silicon and carbon sources, and a solid titanium source soluble in an organic solvent. The use of a solution to apply the titanium source to the silicon and carbon sources makes the distribution of the titanium source on the powder very homogeneous and improves the efficiency of the conversion of the silicon source to beta-silicon carbide whiskers. Organic solvents are preferred for this purpose because many of the useful titanium sources are reactive with, or are insoluble or unstable in, water. The silicon and carbon sources are first reduced to a uniform powder of small particle size, for example, by milling. A solution of the titanium source in an appropriate organic solvent is applied to and then dried on the powder. The powder is then placed in a vessel, preferably having surfaces which will not allow contact with carbon, so that the stoichiometric ratio between the silicon and the carbon is not disturbed. If the crucible or other vessel is graphite, or has a foil containing carbon over some other substrate, it is especially advantageous to coat the innermost furnace surface with boron nitride or any other coating which is inert to the reaction. Then, the vessel and the powder contained therein is heated on the order of 5 minutes to 1 hour in a non-oxidizing atmosphere, such as argon, at a temperature between about 18000° and about 1850° C. (that is, below the sublimation or decomposition temperature of silicon nitride).

If the furnace containing the vessel and the powder is relatively small, it is preferred to use a flowing atmosphere, although a larger furnace does not need a flowing atmosphere.

Optionally, the powder can be pressed, or can be dispersed in a ceramic matrix, before heating. The ceramic matrix is selected from those in which it has conventionally been found useful to include silicon carbide particles as a reinforcement, and silicon nitride powders are preferred matrices for this purpose.

EXAMPLES

The following Examples disclose specific ways in which the method of the present invention can be carried out to form beta-silicon carbide whiskers, in addition, Comparative Example 2 has been included to show the stoichiometric ratios at which platelets are formed instead of the whiskers. The Examples serve merely to illustrate the invention, and not to limit it:

Example 1

18 grams of silicon nitride (UBE-10, a trade designation of Ube Industries, Ltd., Japan) and 2 grams of carbon (acetylene-based carbon black from Chevron Chemical Corporation) were mixed on a rolling mill for 1 hour with silicon nitride milling media. This corresponds to 10 percent by weight carbon, or almost 50 percent stoichiometric with respect to the silicon nitride. 10 grams of the mixture were slurried with acetone, and 3 grams of titanocene dichloride added to the slurry. The mixture was stirred for 5 minutes, and then allowed to evaporate without stirring at 120° C. for 5 hours. The sample was found to have gained 1.3 percent by weight after such treatment. 9.0 grams of the treated powder were placed loosely, without compaction, into a GRAFOIL ®-lined graphite crucible that had first been painted with a boron nitride coating. ("GRAFOIL" is a trademark of Union Carbide Corporation for its brand of flexible graphite foil.) The treated powder was then heated to 1825° C. under a flowing nitrogen atmosphere at 1.0 atmosphere pressure. The sample was maintained at 1825° C. for ½ hour, and then cooled.

After cooling, the sample was free flowing, had a green tint, with no appreciable coating on it. X-ray diffraction analysis and scanning electron microscopy showed the inside and outside of the sample to be essentially identical in morphology and phase chemistry, containing beta-silicon carbide and both alpha- and beta-silicon nitride. High resolution X-ray diffraction analysis showed the material to also contain a very small amount of titanium carbide. The scanning electron microscopy showed the material to contain beta-silicon carbide whiskers having diameters of approximately 0.5 to 0.7 micrometers, and aspect ratios on the order of 10 to 100. These whiskers had almost perfectly smooth and parallel sides with little or no branching present. The silicon nitride was still in the form of a fine (less than 0.5 micrometer) powder. The scanning electron microscopy also showed no evidence of residual carbon being present in the sample after the heat treatment.

Comparative Example 2

A mixture of 19 grams of silicon nitride and 1 gram of carbon was prepared using the same procedure and raw materials as were described above in Example 1. This corresponds to 5 percent by weight carbon, or about 25 percent stoichiometric with respect to the silicon nitride. 10 grams of the mixture were slurried with acetone and 3 grams of titanocene dichloride as described in Example 1. After drying at 120° C. for 36 hours, the sample was found to have gained 1.2 percent by weight. 9 grams of the treated powder were then placed (loosely, without compaction) into a GRAFOIL ® lined graphite crucible. Unlike Example 1, however, the GRAFOIL ® was not first painted with a boron nitride coating. The crucible was heated to 1825° C. under a flowing nitrogen atmosphere at 1.0 atmosphere pressure. The sample was maintained at 1825° C. under a flowing nitrogen atmosphere at 1.0 atmosphere pressure. The sample was maintained at 1825° C. for ½ hour, and then cooled.

After cooling, the sample had a thick green coating on it, about 2 to 4 millimeters thick. The interior portion of the sample was grey in color with a green tint. X-ray diffraction analysis of the outer layer showed it to contain greater than 95 percent crystalline beta-silicon carbide. Scanning electron microscopy revealed the outer layer to contain platelets having diameters on the order of 2.5 micrometers.

The inside of the sample was of a quite different composition. X-ray diffraction analysis of the inside of the specimen showed it to be a very homogeneous mixture composed of both alpha- and beta-silicon nitride and beta-silicon carbide. Scanning electron microscopy revealed that the beta-silicon carbide was in whisker form, the whiskers having diameters of approximately 0.1 to 0.6 micrometers, and aspect ratios on the order of 10 to 50. The quality of the beta-silicon carbide whiskers obtained in Example 1 and in the interior of the product of Example 2 were nearly the same, however, despite the significant difference in the amounts of carbon employed. In this regard, whisker "quality" refers to a combination of whisker size, whisker aspect ratio and the smoothness of the whiskers. Example 3

A mixture containing 19 g of silicon nitride and 1 g of carbon was prepared with titanocene dichloride using the procedure described in Example 2. However, Comparative Example 2 shows the amount of carbon to be used before you get platelets rather than whiskers. The 19 to 1 weight ratio above corresponds no about 25 percent stoichiometric. The mixture was heated in the same fashion as in Example 2, except that the GRAFOIL ® lining the graphite crucible was painted with a boron nitride coating before the mixture was placed in it.

After cooling, the resulting product was found to be identical in composition to the interior portion of the product of Example 2. Unlike the product of Example 2, however, no reaction of the outer surface of the product with the GRAFOIL ® was found to have occurred.

Examples 1 through 3 above show that with limited amounts of carbon and in the presence of titanocene dichloride, silicon nitride (at an appropriate temperature) forms beta-silicon carbide whiskers through consumption of all of the carbon present, to the exclusion of other silicon carbide products. In Examples 1 and 3, the amount of carbon is limited by isolation of the silicon nitride from the graphite foil by the boron nitride coating. In Example 2, it appears that the outer layer of the powder mixture may have reacted with the carbon in the graphite pan itself, but that the resulting platelets may have isolated the silicon nitride in the interior of the sample from the carbon in the graphite pan, and permitted formation of the beta-silicon carbide whiskers in the interior of the product.

Example 4

A 20 g sample containing 19 g of silicon nitride and 1 g of carbon was prepared with titanocene dichloride using the procedure described above in Example 1. This corresponds to about 25 percent stoichiometric. The material was heat treated in a graphite crucible lined with boron nitride-coated GRAFOIL ® at 1800° C. for ½ hour, as in Example 1. The only difference was that the atmosphere was flowing argon gas instead of nitrogen. After cooling, the sample was examined by X-ray diffraction analysis and scanning electron microscopy. The sample was found to be homogenous throughout and was composed mainly of beta-silicon carbide and both alpha- and beta-silicon nitride. The scanning electron microscopy showed that the beta-silicon carbide was mainly in the form of high quality whiskers with average diameters of approximately 0.5 micrometers and aspect ratios of 10 to 100. A small concentration of platelets was found, the platelets being 1 to 3 micrometers in diameter by 0.5 micrometers thick. The whiskers were fairly smooth and straight. It was noted that both the quality and concentration of whiskers was higher than obtained in Example 5, below, where nitrogen was used at 1800° C.

Example 5

A 20 g sample containing 19 g of silicon nitride and 1 g of carbon was prepared with titanocene dichloride using the procedure described above in Example 1. This corresponds to about 25 percent stoichiometric. The material was heat treated in a graphite crucible lined with boron nitride-coated GRAFOIL ® at 1800° C. in a nitrogen atmosphere for ½ hour, as in Example 1. After cooling, the sample was examined by X-ray diffraction analysis and scanning electron microscopy. The sample was found to be homogenous throughout and was composed mainly of beta-silicon carbide and both alpha- and beta-silicon nitride. The scanning electron microscopy showed that the beta-silicon carbide was in the form of both whiskers and platelets, mostly whiskers. The relative amount of whiskers was less than that found in Example 1 (conducted at 1825° C.). The platelets were approximately 2 micrometers in diameter and were less than 1.0 micrometers thick. It was noted that the sides of the whiskers formed in this case were still very straight and smooth, and the quality of the whiskers was still very good, even though platelets were also formed. The quality and concentration of whiskers was not as good as in Example 5, however, where an argon atmosphere was employed.

Example 5 suggests that the lower temperature limit for the formation of acceptable beta-silicon carbide whiskers from silicon nitride as a silicon source is lower when the heating atmosphere is flowing argon, than it is with flowing nitrogen. These Examples alternatively suggest that a flowing argon atmosphere yields higher quality whiskers and more numerous whiskers from silicon nitride than a flowing nitrogen atmosphere, at a given temperature. The reason may be related to the dissociation equilibrium:

$Si_3N_4 \to 3Si(liquid) + 2N_2(gas)$.

A net removal of nitrogen by the flowing argon atmosphere encourages the dissociation of silicon nitride and increases the partial pressure of the silicon, or whatever other silicon-containing species that might form, for reaction with the carbon source to yield beta-silicon carbide whiskers.

SEPARATION AND USE OF PRODUCT

Separation of the mixed beta-silicon carbide whiskers and residual silicon nitride in the products disclosed in any of Examples 1-5 is expected to be straightforward. For example, the product can be placed into acetone and subjected to ultrasound. Alternatively, the product can be subjected to air classification. Further, depending upon the sizes of the whiskers in the product, separation can likely be achieved by conventional screening. The homogeneity and ready separation of the whiskers obtained by the method of the present invention eliminate many of the handling problems associated with other methods of manufacturing beta-silicon carbide whiskers.

Separation of the desired silicon carbide whiskers from any unreacted silicon source may be eased by repeating treatment of the mixed product before separation, thereby increasing product yield. The mixed product would be heated in the same manner as disclosed, except that the amounts of added carbon and the titanium source would be based upon the weight of the unreacted silicon source remaining in the product after initial treatment. Indeed, it may be possible to convert enough of the silicon source to silicon carbide whiskers, through repeated treatment, to make separation of any residual source or non-whisker particles unnecessary, as a practical matter.

Once separated, the whiskers produced by the present invention may be used in any conventional fashion. Of course, there are circumstances under which separation of the whiskers from the silicon source may not be desirable. For example, a homogeneous product containing a mixture of silicon nitride (or another suitable silicon source) and beta-silicon carbide whiskers may have significant utility as a reactant or as a separate constituent in other methods or compositions. The same may be true of a homogeneous product containing both beta-silicon carbide whiskers. For this reason, it is expected that products obtained at temperatures below the preferred temperature range may still have some degree of utility, even though the products may contain only a minor proportion of silicon carbide whiskers and a substantial proportion of non-whisker particles, or though the silicon carbide whiskers in them are poorly formed.

In accordance with the second aspect of the invention, a dispersal of beta-silicon carbide whiskers in a ceramic matrix can alternatively be obtained by the direct in situ conversion of a silicon source in that matrix to the eta-silicon carbide whiskers, by the method of the present invention. This advantageously avoids the dispersal problems conventionally encountered in attempting to introduce silicon carbide whiskers into a ceramic matrix. The in situ conversion is not easily carried out by adding powdered silicon and carbon sources (such as silicon nitride powder milled with carbon black, having titanocene dichloride dried thereon) to a conventional ceramic material such as particulate alumina or silicon carbide, and then converting the silicon and carbon sources to beta-silicon carbide whiskers. The matrix, thus containing enforcing beta-silicon carbide whiskers (as well as unconverted silicon source), can be pressed, heated, densified or otherwise treated as appropriate to the intended end use of the matrix.

Whether formed in situ or separately, the whiskers obtained will likely be cleaner than comparable products obtained by conventional methods, and will likely have physical characteristics which are superior to those of presently available products, because of the high efficiency of conversion to beta-phase enjoyed by the present invention.

The present invention thus provides a rapid and efficient method for making silicon carbide whiskers in which a very high percentage of the silicon carbide whiskers is beta-phase in crystalline form. The product contains silicon carbide whiskers which are very homogeneous in comparison to prior materials, possessing superior uniformity of character and size. Additionally, the present invention also provides a method for producing silicon carbide whisker-reinforced ceramic matrices.

While the invention has been described in terms of several specific embodiment, it must be appreciated that other embodiments could readily be adapted by one skilled in the art. Accordingly, the scope of the invention is to be limited only by the following claims.

What is claimed is:

1. A method for forming beta-silicon carbide whiskers, said method comprising heating a solid silicon source and a carbon source in the presence of a titanium catalyst, wherein said silicon source is silicon nitride powder and said titanium catalyst is selected from the group consisting of organotitanium coordination compounds and titanium-containing materials other than the organotitanium coordination compounds.

2. The method of claim 1, wherein said silicon source and said carbon source are powders.

3. The method of claim 2, further comprising mixing said silicon source, said carbon source and said titanium catalyst together before heating.

4. The method of claim 2, further comprising applying said titanium catalyst on said silicon and carbon sources by disposing a liquid solution of the titanium catalyst thereon, and drying the solution thereon before the step of heating.

5. The method of claim 1, further comprising preheating said silicon carbon and titanium to decompose the titanium catalyst on the silicon and carbon sources before heating.

6. The method of claim 1, further comprising disposing said silicon and carbon sources in a ceramic matrix before the heating.

7. The method of claim 6, wherein said matrix includes silicon nitride, alumina or silicon carbide powder.

8. The method of claim 1, wherein said heating is between about 1800° C. and 1850° C. in a non-oxidizing atmosphere.

9. The method of claim 8, wherein said atmosphere includes argon or nitrogen.

10. The method of claim 1, wherein the heating is for about 5 minutes to about 1 hour.

11. The method of claim 1, wherein said carbon source is carbon black.

12. The method of claim 1, wherein said titanium catalyst is titanocene dichloride.

13. The method of claim 1, wherein said titanium catalyst is titanocene dichloride.

14. The method of claim 1, wherein said organotitanium coordination compound is selected from the group consisting of titanocenes, titanium chelates, and titanium di-, tri- and tetraesters.

15. The method of claim 1, wherein the heating step is performed in isolation from excess carbon so that the carbon can be maintained at between more than zero and less than or equal to about 60 percent of stoichiometric with respect to the silicon.

* * * * *